(12) United States Patent
Novack et al.

(10) Patent No.: US 10,816,740 B2
(45) Date of Patent: Oct. 27, 2020

(54) FLIP CHIP BONDING ONTO A PHOTONIC INTEGRATED CIRCUIT

(71) Applicant: ELENION TECHNOLOGIES, LLC, New York, NY (US)

(72) Inventors: Ari Novack, New York, NY (US); Saeed Fathololoumi, San Gabriel, CA (US); Michael Caverley, Mountain View, CA (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 16/265,198

(22) Filed: Feb. 1, 2019

(65) Prior Publication Data

US 2020/0249405 A1 Aug. 6, 2020

(51) Int. Cl.
*G02B 6/12* (2006.01)
*G02B 6/42* (2006.01)
*H01L 23/00* (2006.01)
*H01L 25/16* (2006.01)

(52) U.S. Cl.
CPC ........... *G02B 6/4274* (2013.01); *G02B 6/423* (2013.01); *G02B 6/4236* (2013.01); *H01L 24/02* (2013.01); *H01L 24/42* (2013.01); *H01L 25/16* (2013.01); *H01L 2224/023* (2013.01)

(58) Field of Classification Search
CPC .......... G02B 6/4214; G02B 6/43; G02B 6/12; G02B 6/3818; G02B 6/3869
See application file for complete search history.

(56) References Cited

U.S. PATENT DOCUMENTS

| | | | |
|---|---|---|---|
| 2016/0197391 A1* | 7/2016 | Li | H01P 3/003 333/208 |
| 2018/0011248 A1* | 1/2018 | Bourstein | G02B 6/4245 |
| 2019/0101392 A1* | 4/2019 | Bischel | G01C 19/721 |

* cited by examiner

*Primary Examiner* — Jennifer Doan
(74) *Attorney, Agent, or Firm* — Stratford Managers Corporation

(57) ABSTRACT

Conventional hybrid photonic integrated circuits (PIC) combine one type of semiconductor platform for the main PIC, and a different type of semiconductor platform for a secondary chip. Conventional mounting processes include forming a recess in the main PIC, and mating electrical connectors from the secondary chip and the main PIC within the recess. Mating the first and second electrical connectors in the recess increases the complexity of forming the main PIC, and hampers heat dissipation from secondary chip through oxide layers in the main PIC. Providing a conductive, e.g. redistribution, layer from the first electrode along the bottom and sides of the recess eliminates the complexity in forming the main PIC, and enables the first electrical connector to be mounted directly onto a more thermally conductive substrate material.

10 Claims, 9 Drawing Sheets

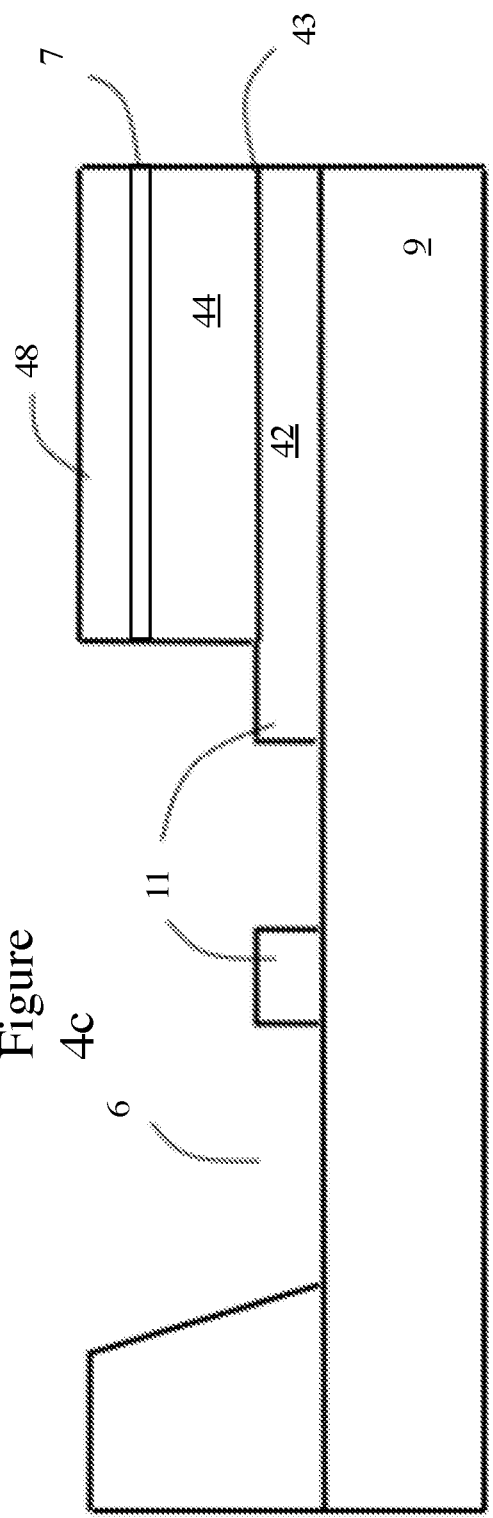
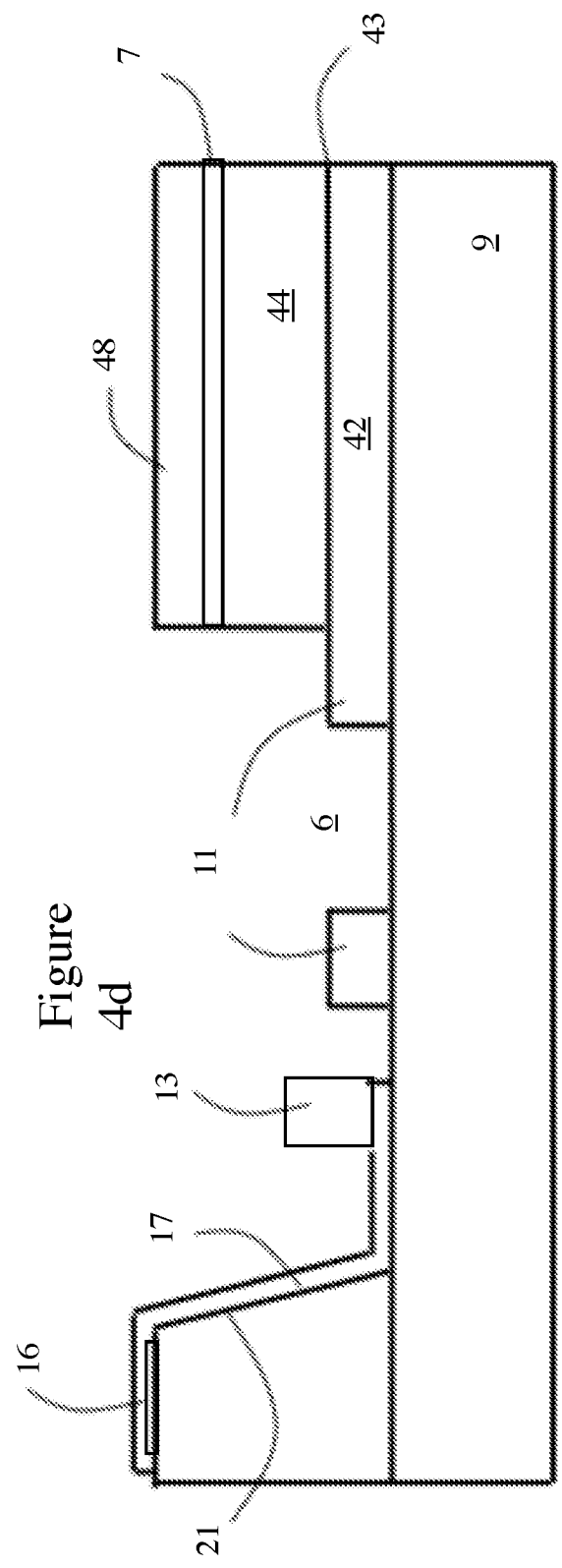

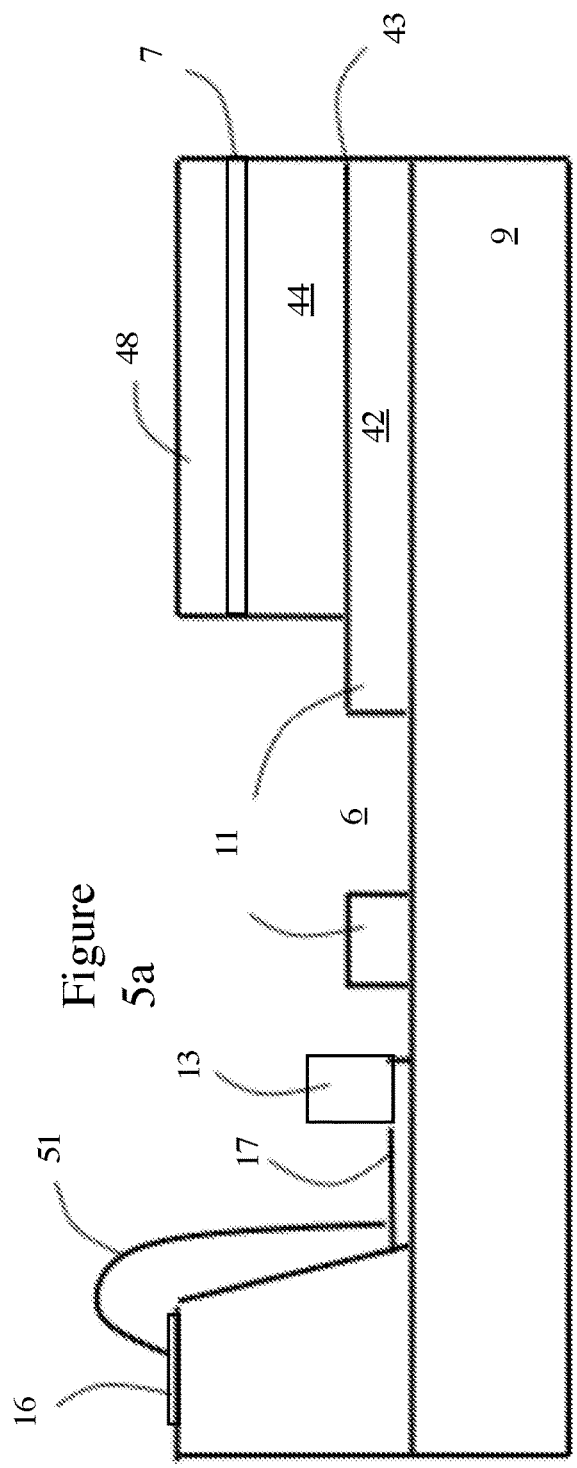
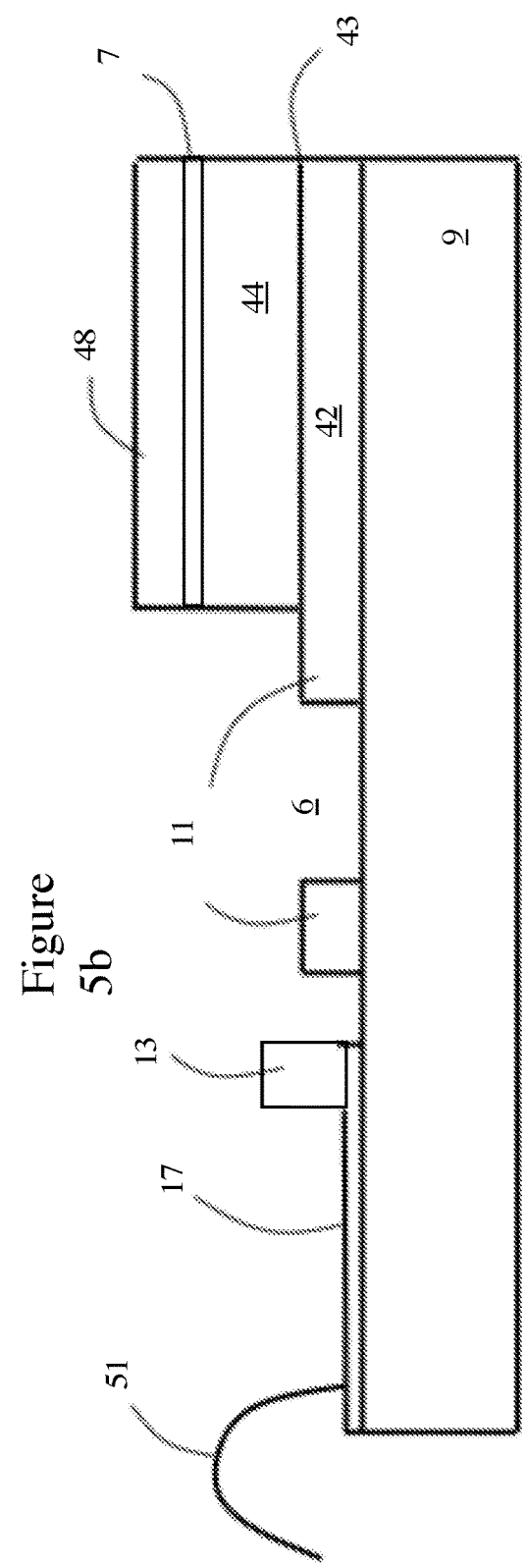

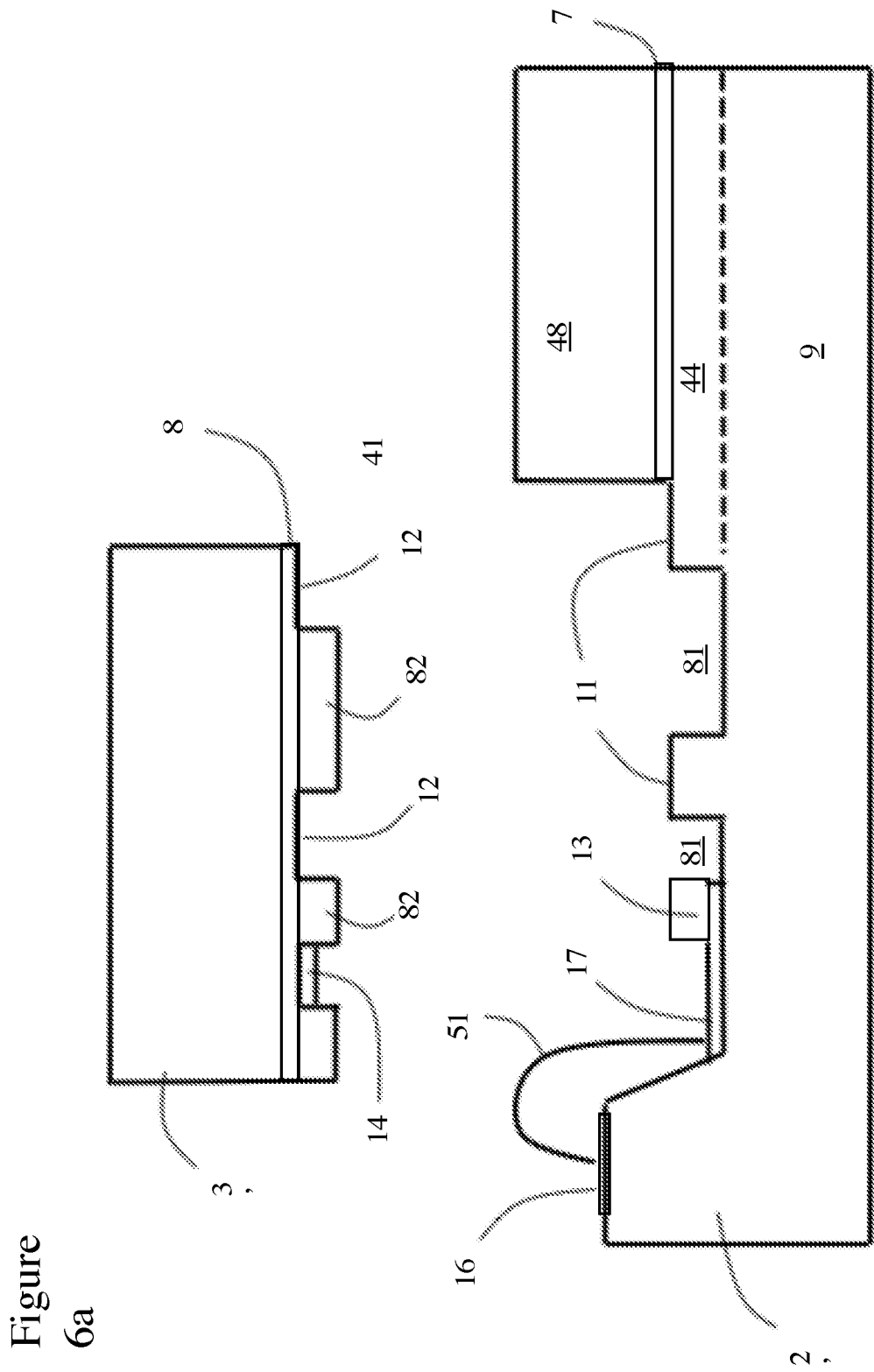

FLIP CHIP BONDING ONTO A PHOTONIC INTEGRATED CIRCUIT

TECHNICAL FIELD

The present invention relates to flip chip bonding onto a photonic integrated circuit, and in particular to electrically connecting a flip chip mounted chip to a photonic integrated circuit.

BACKGROUND

Conventional hybrid photonic integrated circuits, which combine one type of semiconductor platform for the main photonic integrated circuit (PIC) device layer, e.g. silicon photonic integrated circuit, and a different type of semiconductor platform for a secondary chip, e.g. a Group III-V material for a gain medium, may utilize a flip chip bonding process to mount the secondary chip onto the main PIC. Conventional flip chip mounting processes, such as the one disclosed in U.S. Pat. No. 9,817,197 issued Nov. 14, 2017 in the name of Kinghorn et al, which is incorporated herein by reference, include forming a recess in the main PIC, forming a first electrical connector in the bottom of the recess, and mating a second electrical connector on the secondary chip to the first electrical connector in main PIC within the recess. Mating the first and second electrical connectors in the recess increases the complexity of forming the first connector, and may lead to alignment problems, and the inability to test the connection, since both the first and second connectors can not be seen when the secondary chip is mounted on the main PIC. Furthermore, heat dissipation from the gain medium is hampered by oxide layers in the PIC, which do not provide high thermal conductivity.

An object of the present invention is to overcome the shortcomings of the prior art by providing an electrical connection between a main PIC and a secondary chip that is easier to make, assemble and test.

SUMMARY OF THE INVENTION

Accordingly, the present invention relates to a hybrid photonic integrated circuit (PIC) comprising:

a main photonic integrated circuit (PIC), including a first waveguide, an electrical connector for transmitting electrical signals from an external source, and a first electrode mounted in a recess therein;

a secondary device mounted in the recess, including a second waveguide, aligned with the first waveguide, and a second electrode connected to the first electrode; and a conductive layer extending from the first electrode along the bottom of the recess out from underneath the secondary device and electrically connected to the electrical connector.

Another aspect of the present invention relates to a method of fabricating a hybrid photonic integrated circuit (PIC) comprising:

a) forming a main photonic integrated circuit (PIC), comprising; providing a multi-layer PIC structure; executing a first etch in the multi-layer PIC structure at a first level to form first alignment features; executing a second etch in the multi-layer PIC structure at a second level to form a recess with bottom and rear walls; forming a conductive layer along the bottom of the recess; mounting a first electrode in the recess connected to the conductive layer; and mounting an electrical connector on a surface of the multi-layer PIC structure connected to the conductive layer remote from the first electrode;

b) mounting a secondary device in the recess with the conductive layer extending out from underneath the secondary device; and c) connecting the secondary device to the main PIC.

BRIEF DESCRIPTION OF THE DRAWINGS

The invention will be described in greater detail with reference to the accompanying drawings which represent preferred embodiments thereof, wherein:

FIGS. 4a to 4e illustrate a fabrication process of the device of FIG. 1.

FIG. 5a is a cross-sectional view of a main platform for hybrid photonic integrated circuit device in accordance with an alternative embodiment of the present invention;

FIG. 5b is a cross-sectional view of a main platform for hybrid photonic integrated circuit device in accordance with another alternative embodiment of the present invention;

FIG. 6a is an exploded cross-sectional view of a hybrid photonic integrated circuit device in accordance with an alternative embodiment of the present invention; and FIG. 6b is a cross-sectional view of an assembled hybrid photonic integrated circuit device in accordance with the embodiment of FIG. 6a.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
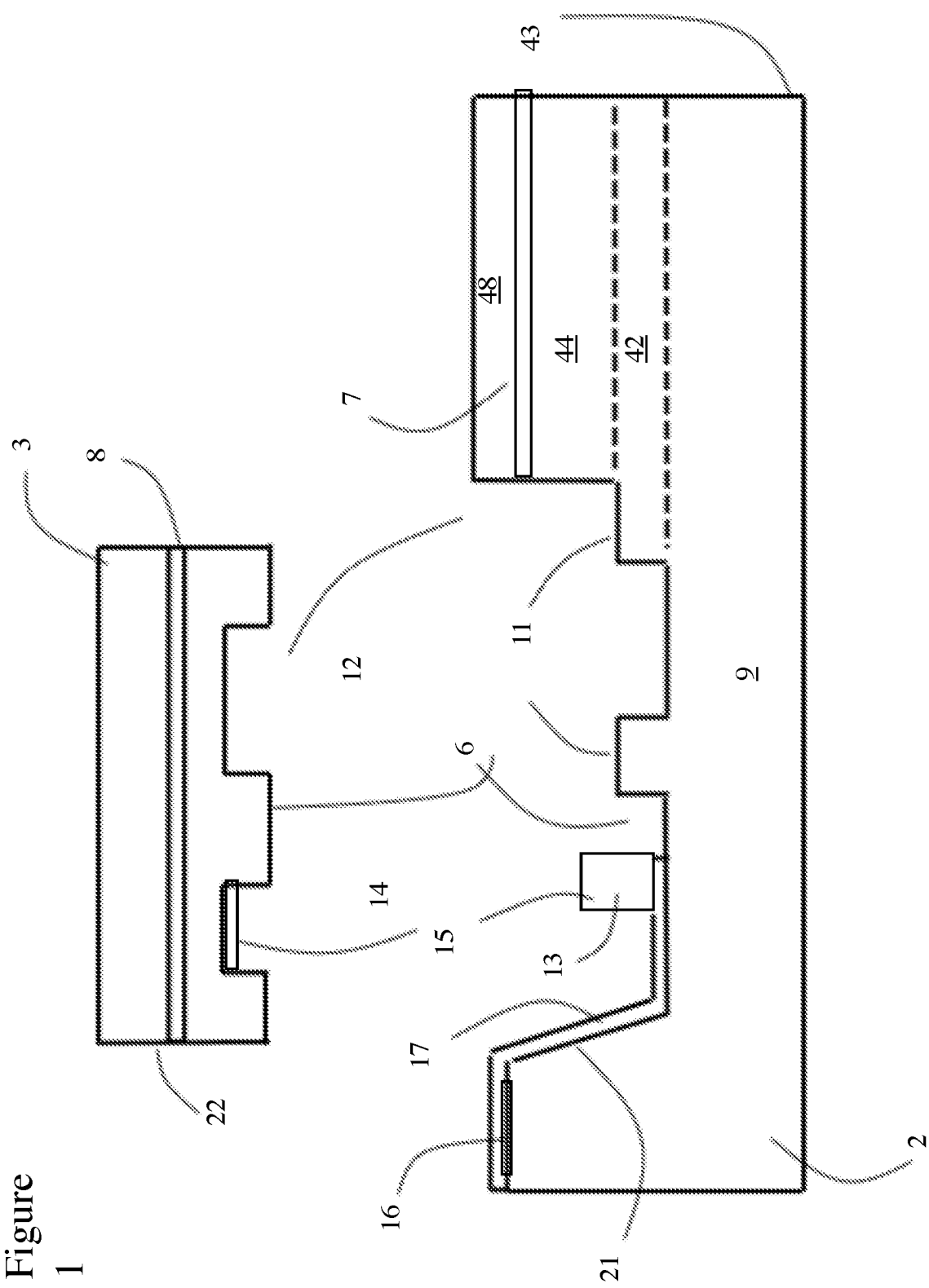
FIG. 1 is an exploded cross-sectional view of a hybrid photonic integrated circuit device in accordance with an embodiment of the present invention.
Figure 2:
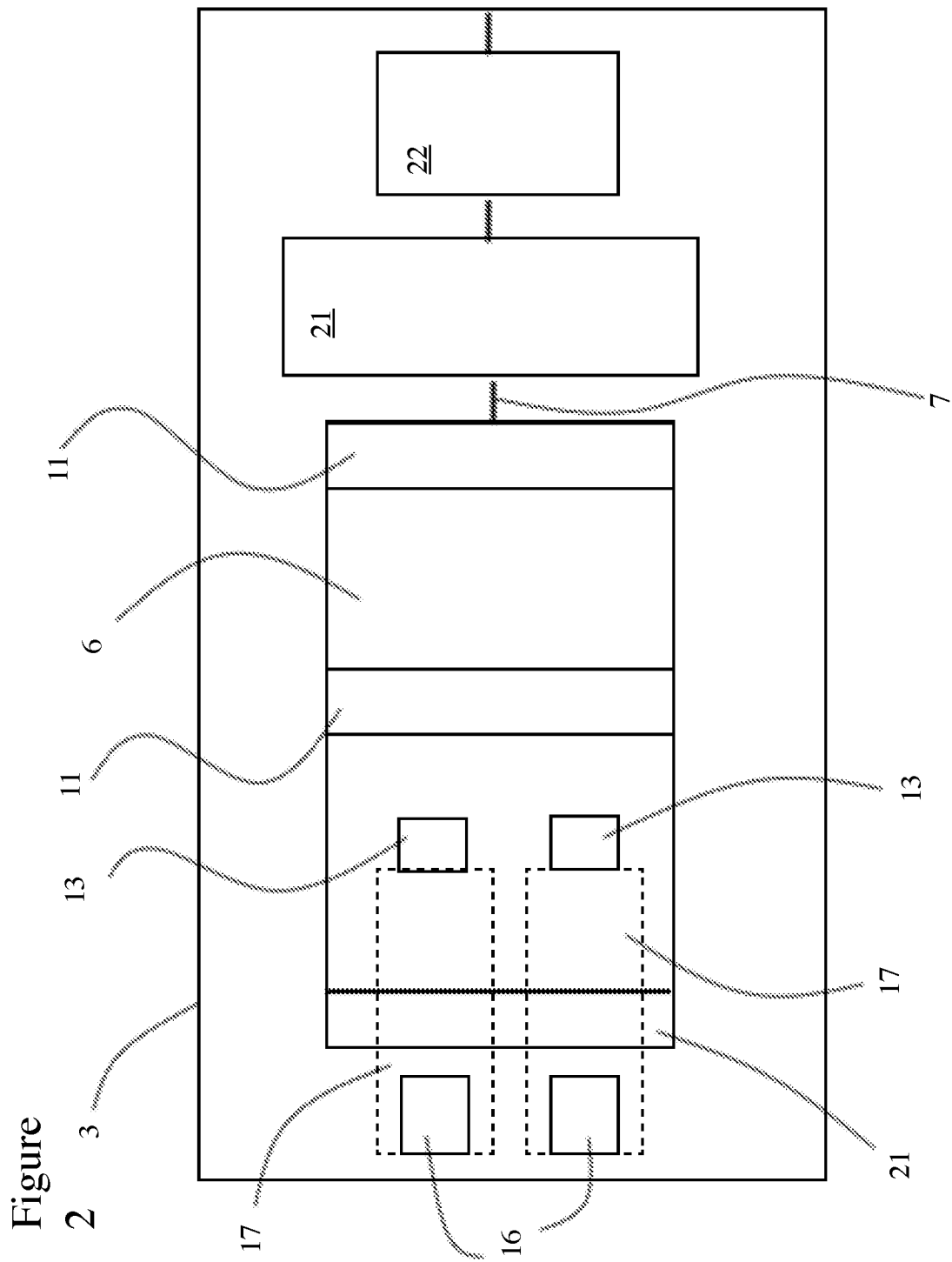
FIG. 2 is a top view of a main platform for the device of FIG. 1.
Figure 3:
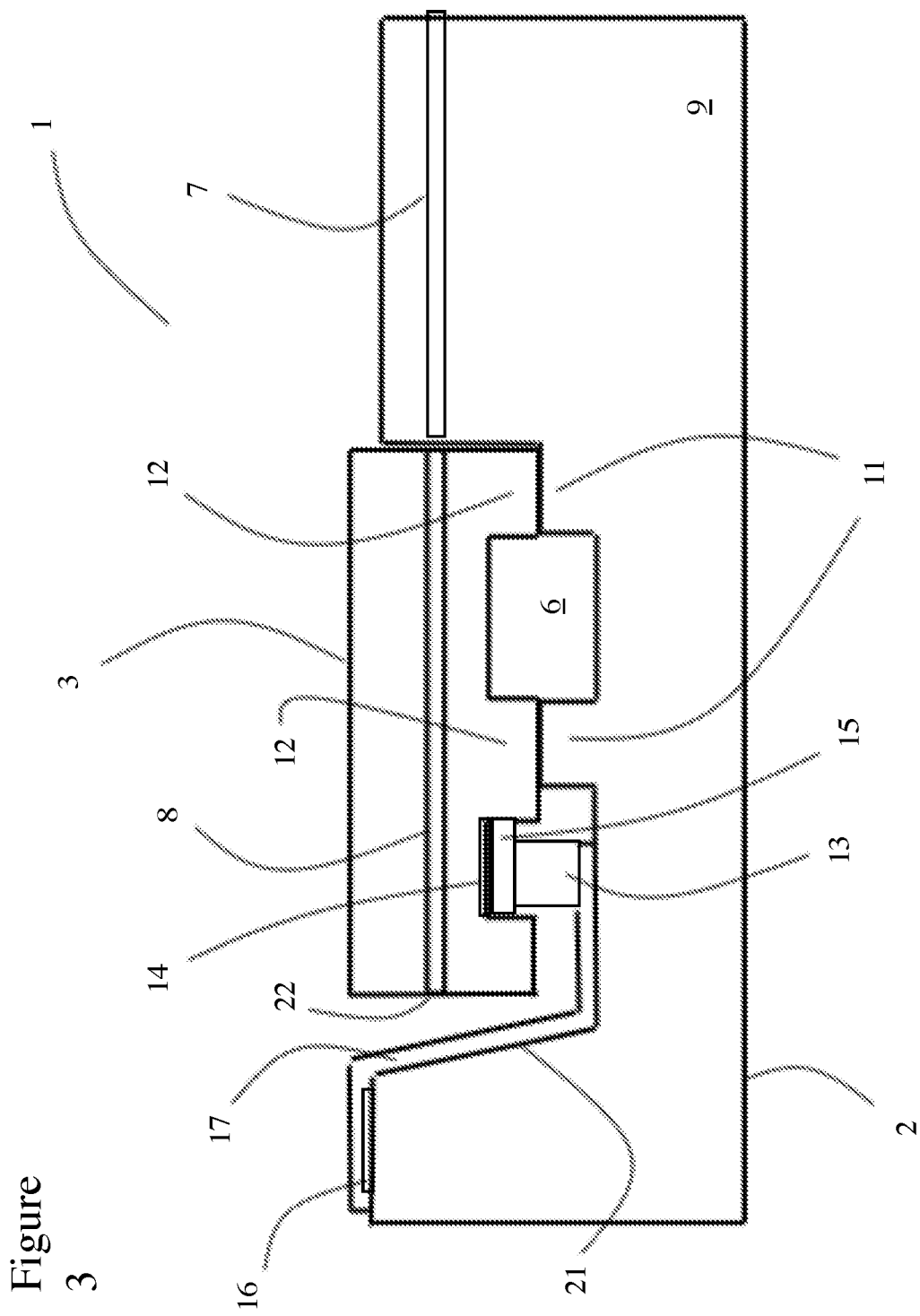
FIG. 3 is a cross-sectional view of the assembled device of FIG. 1.

With reference to FIGS. 1 to 3, a hybrid photonic integrated circuit 1, in accordance with an exemplary embodiment of the present invention, includes a main device 2, which may be comprised of a first type of semiconductor platform, e.g. silicon photonic integrated circuit, and a secondary chip 3, which may be comprised of a different type of semiconductor platform, e.g. a Group III-V material for a gain medium. Typically, the secondary chip 3 is fabricated separately, and then mounted in or on the main device 2 utilizing any suitable fabrication process, e.g. a flip chip bonding process.

The main device 2 may include a recess 6 formed, e.g. etched, therein to receive the secondary chip 3. Ideally, the recess 6 is etched down through all of the oxide, etch stop or cladding layers to enable contact with a more thermally conductive substrate layer 9, e.g. silicon. The recess 6 may include one or more alignment features for aligning a first optical waveguide core layer 7 in the main device 2 with a second optical waveguide core layer 8 in the secondary device 3. The alignment features in the recess 6 may include first vertical alignment features 11, comprised of hard stop surfaces for abutting corresponding second alignment features 12 in the form of hard stop surfaces provided on the secondary chip 3. The first vertical alignment features 11 may be at or close to the first optical waveguide 7 or the first vertical alignment features 11 may be spaced apart from the first optical waveguide 7. Similarly, the second vertical alignment features 12 may be at or close to the second optical waveguide 8 or the second vertical alignment features 12 may be spaced apart from the second optical waveguide 8. The first and second vertical alignment features 11 and 12 may be an etched surface, e.g. epitaxially defined, from a cladding layer, a waveguide layer or a buffer layer, as disclosed in U.S. Pat. No. 9,817,197 (Kinghorn et al).

At least one first electrode 13 is provided in the recess 6 for extending into contact or close proximity with a corresponding second electrode 14 on the secondary device 3, thereby enabling power and/or control signals to be transmitted between the main device 2 and the secondary device 3. Solder 15 may be provided on one or both of the first and second electrodes 13 and 14 to enable permanent connection therebetween during a solder reflow process step. The first and second electrodes 13 and 14 may each be comprised of a stack of conductive metals, e.g. including layers of metals selected from the group consisting of Ni, Cu, Ti, Al, Ti/W, and Au. For example; the first electrode 13 may comprise a stack of Al, Ti, Cu, and Ni, each layer 0.1 μm to 1.5 μm thick, while the second electrode 14 may comprise a stack of alternating TiW and Au, each layer 0.04 μm to 1.0 μm thick. Electrical connectors, such as access pads 16, may be disposed on an alternate, surface of the main device 2, e.g. on an upper surface vertically spaced from the bottom of the recess 6, remote from underneath the secondary device 3, to provide easy access thereto by external controllers and power sources. To connect the conductive electrodes 13 to the access pads 16, while eliminating the need for complicated processing of the layers in the main device 2, a conductive, e.g. redistribution, layer 17, e.g. gold or other suitable conductive material, may be formed extending from the bottom of each conductive electrode 13, along the bottom of the recess 6, up the side or rear wall 21 of the recess 6 into contact with the access pads 16. The conductive, e.g. redistribution, layer 17 should have cross-section dimension, i.e. width and thickness, large enough to conduct current to the first and second electrodes 13 and 14, but small enough to extend out from under the end of the secondary device 3 without making contact, i.e. through a gap between the main device 2 and the secondary device 3. The side or rear wall 21 of the recess 6 may be perpendicular to the bottom of the recess 6 or preferably formed at an obtuse angle therefrom, e.g. 95°-120°, as a result of a dry etch process step.

The main device 2 may also comprise other optical and electro-optical components 21 in a device layer, such as optical filters and partially reflective mirrors forming an integrated portion of a laser cavity, which may also include the gain medium in the secondary device 3 and a fully reflective surface 22 provided on or proximate to the gain medium in the secondary device 3, as disclosed in U.S. patent application Ser. No. 15/903,835 filed Feb. 23 2018 in the name of Baehr-Jones et al, and Ser. No. 15/975,375 filed May 9, 2018 in the name of Baehr-Jones et al, which are incorporated herein by reference. Other optical, electrical, and electro-optical components 22 may also be provided, such as modulators, monitoring systems, and control systems.

With reference to FIGS. 4a to 4d, an example process for fabricating the main device 2 includes providing a multi-layer photonic integrated circuit structure 41, including the thermally conductive substrate 9. The structure 41 may also include first dielectric layer, such as a first oxide layer 42, e.g. silicon dioxide, a stop layer 43, e.g. silicon nitride, a second dielectric or cladding layer, such as a second oxide layer 44, e.g. silicon dioxide, a waveguide layer 47, e.g. silicon, which will provide waveguide 7, and, if necessary, a top dielectric or cladding layer 48, e.g. an oxide, such as silicon dioxide.

Figure 4A:
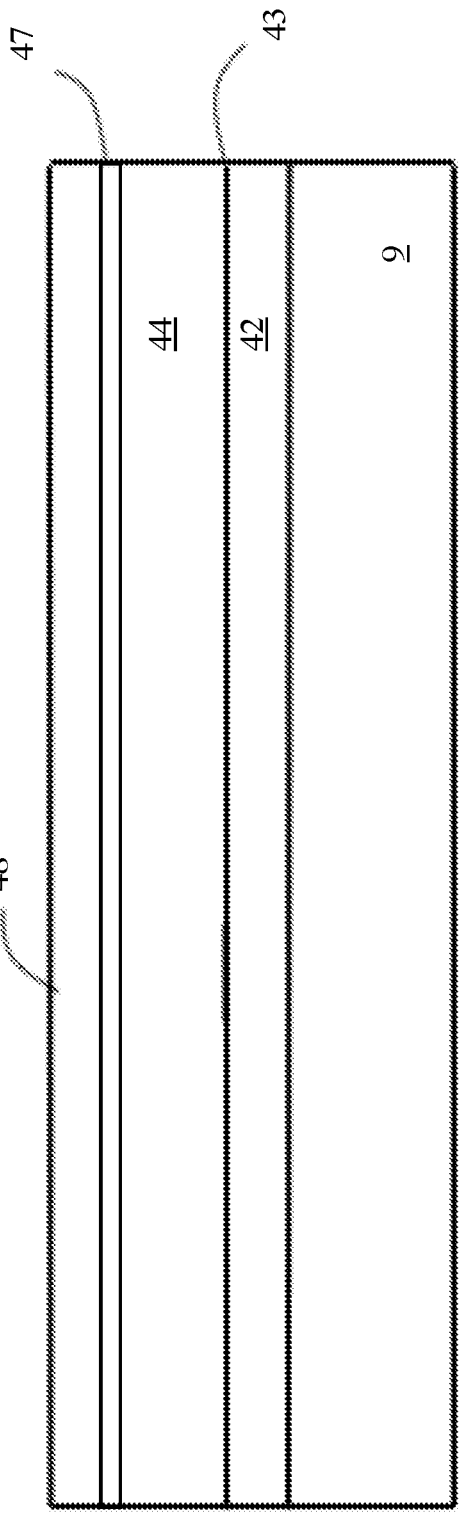
Figure 4B:
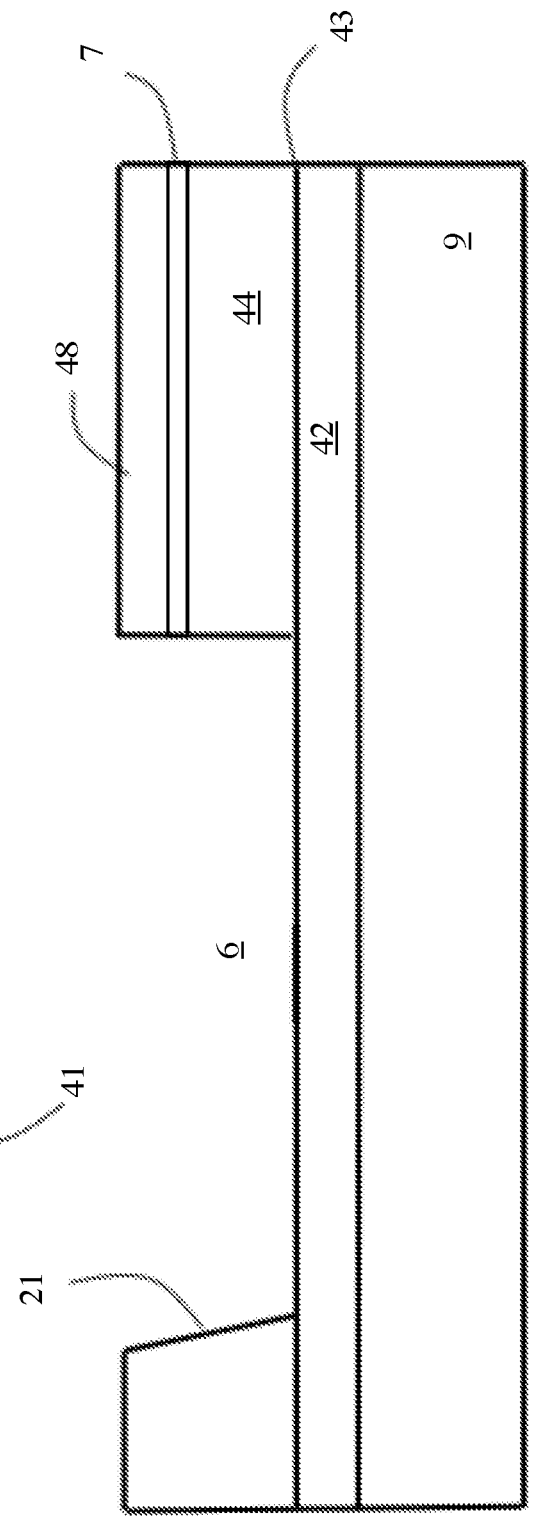

The second step, illustrated in FIG. 4b, includes masking the structure 41 to define the recess 6, and performing a first etching step to form the recess 6 down to the level of the etch-stop layer 43, i.e. the first alignment features 11, which may be in a waveguide layer, a cladding layer or a buffer layer.

The third step, illustrated in FIG. 4c, includes masking the upper surface of the partially etched recess 6 to define the first alignment features 11, and performing a second etching step to form the first alignment features 11 down to a second lower level, e.g. the level of the substrate 9.

The fourth step, illustrated in FIG. 4d, includes mounting the electrical connectors, e.g. pads 16, on an upper surface of the main device 2, then forming the redistribution layer 17, e.g. 2 μm-5 μm thick, along the bottom and side surfaces 21 of the recess 6 to the pads 16, and then mounting the layers of the first electrodes 13, e.g. 4 μm-8 μm thick in the recess 6 on the redistribution layer 17.

Figure 4E:
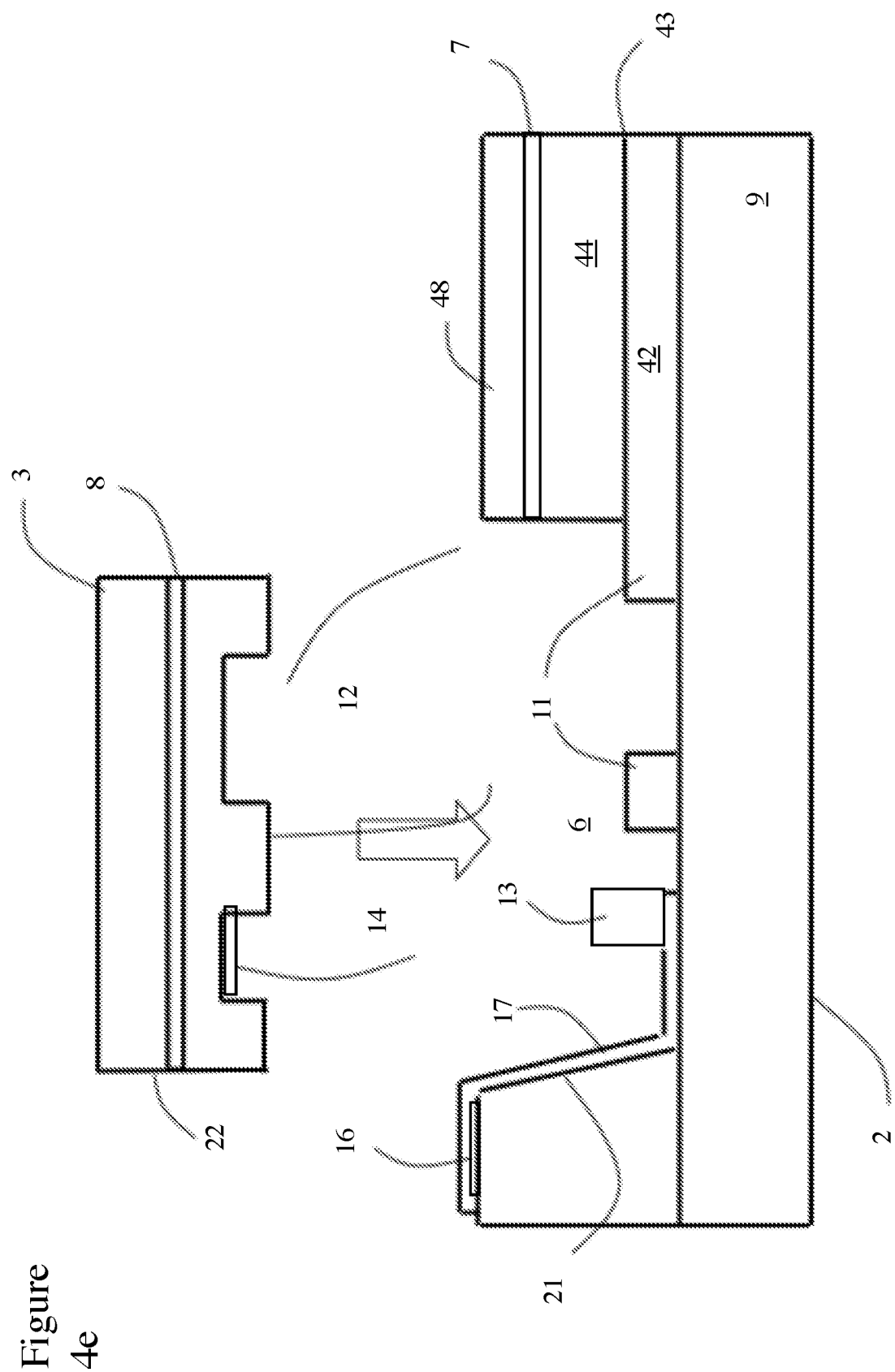

The final step, illustrated in FIG. 4e, includes mounting the secondary device 3 on the main device 2, e.g. flip chip bonding. The mounting step may include lowering the secondary device 3 until the second alignment features 12 engage the first alignment features 11, aligning the second optical waveguide 8 with the first optical waveguide 7, e.g. in the horizontal x and z planes, and then fixing the second electrode 14 to the first electrode 13. The fixing step may include heating solder 15 provided on one or more of the first and second electrodes 13 and 14 until the solder begins to flow, and then cooling the solder 15 to form a bond between the first and second electrodes 13 and 14.

In an alternate embodiment, the fourth step, illustrated in FIG. 5a, may include mounting the electrical connectors, e.g. the pads 16, on an upper surface of the main device 2, then forming the conductive, e.g. redistribution, layer 17, e.g. 2 μm-5 μm thick, along the bottom of the recess 6, and then connecting a wire bond 51, e.g. gold, between the conductive, e.g. redistribution, layer 17 and the pads 16. The layers of the first electrodes 13, e.g. 4 μm-8 μm thick may then be mounted in the recess 6 on the conductive, e.g. redistribution, layer 17.

In an alternate embodiment, the fourth step, illustrated in FIG. 5b, may omit the pads 16 and even an upper surface of the main device 2, and simply include forming the conductive, e.g. redistribution, layer 17, e.g. 2 μm-5 μm thick, along the bottom of the recess 6, and then connecting a conductive wire bond 51, e.g. gold, between the conductive, e.g. redistribution, layer 17 and an adjacent device, e.g. printed circuit board, as the electrical connector. The layers of the first electrodes 13, e.g. 4 μm-8 μm thick may then be mounted in the recess 6 on the conductive, e.g. redistribution, layer 17.

Figure 6B:
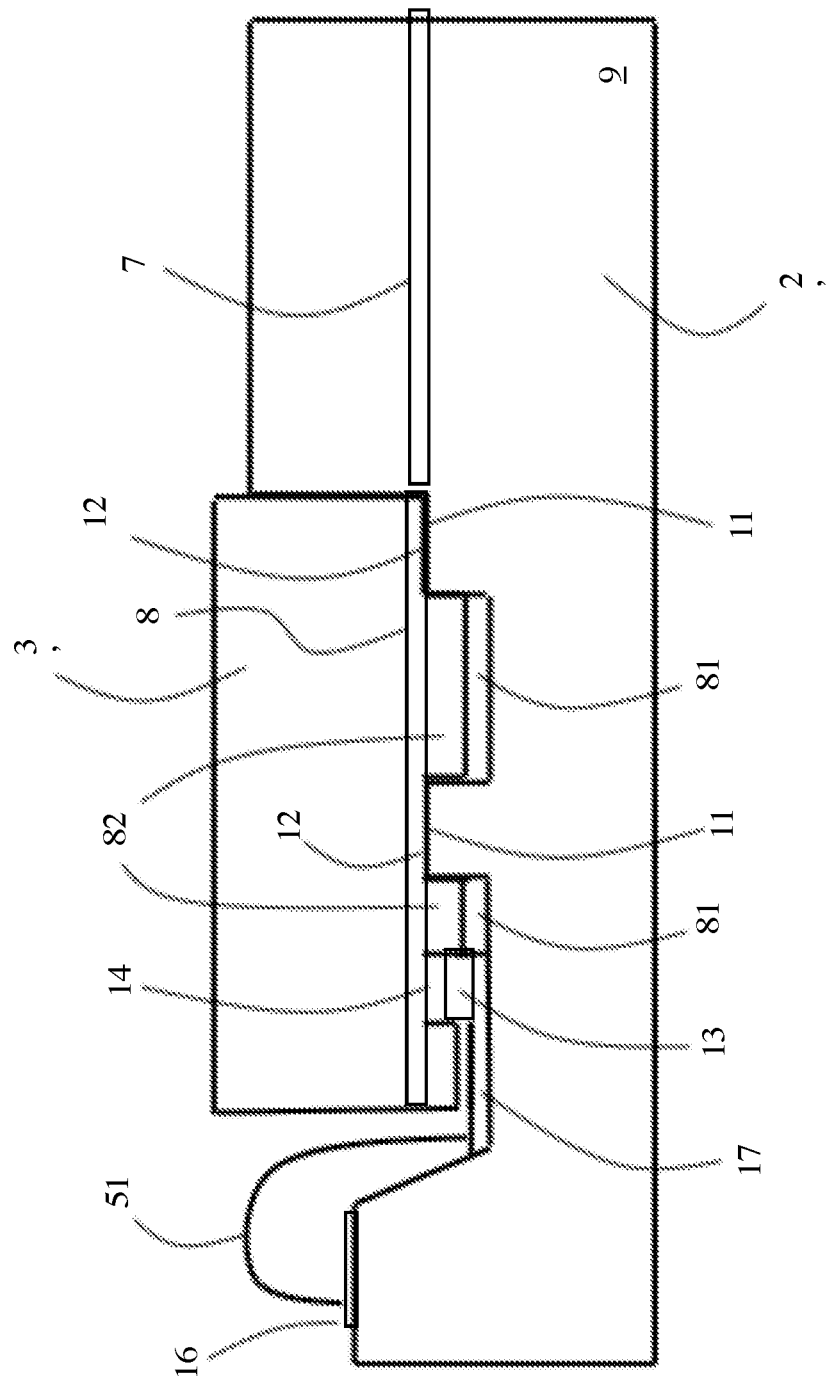

In an another alternate embodiment, illustrated in FIG. 6, in a main device 2' the first vertical alignment features 11 may be at or substantially at the first optical waveguide core layer 7, and in a secondary device 3' the second vertical alignment features 12 may be at or substantially at the second optical waveguide core layer 8.

Accordingly, the second step would include masking the structure 41 to define the recess 6, and performing a first etching step to form the recess 6 down to the level of the etch-stop layer 43, i.e. the first alignment features 11, which may be the waveguide 7. The third step then includes masking the upper surface of the partially etched recess 6, to define the first alignment features 11, and performing a second etching step to form the first alignment features 11 down to a second lower level below the waveguide 7 and the device layer, e.g. the level of the substrate 9. Cavities 81 may be formed adjacent to the first alignment features 11 in the recess 6, which are a suitable size, e.g. depth and width, to receive extensions 82, which may extend from a bottom surface of the secondary device 3. The cavities 81 and extensions 82 may provide additional alignment features for aligning the first and second waveguides 7 and 8, e.g. in the z-direction perpendicular to the alignment features 11 and 12.

In the illustrated embodiment, the wire bond 51 is used to connect the conductive, e.g. redistribution, layer 17 to the pads 16, but any of the other connections, discussed hereinbefore, are also possible.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A hybrid photonic integrated circuit (PIC) comprising:
   a main photonic integrated circuit (PIC), including a first waveguide, an electrical connector for transmitting electrical signals from an external source, and a first electrode mounted in a recess therein;
   a secondary device mounted in the recess, including a second waveguide, aligned with the first waveguide, and a second electrode connected to the first electrode;
   a conductive layer extending from the first electrode along a bottom of the recess out from underneath the secondary device, and electrically connected to the electrical connector;
   a first alignment feature extending from the bottom of the recess and spaced apart from the first waveguide; and
   a second alignment feature on the secondary device spaced apart from the second waveguide in contact with the first alignment feature;
   wherein the first electrode and/or the second electrode comprises a stack of conductive metal layers extending from the conductive layer at the bottom of the recess to the secondary device.

2. The hybrid PIC according to claim 1, wherein the electrical connector comprises an electrical pad on an upper surface of the main PIC vertically spaced from the bottom of the recess; and wherein the conductive layer extends along the bottom of the recess and a sidewall of the recess into contact with the electrical pad.

3. The hybrid PIC according to claim 2, wherein the sidewall of the recess is at an obtuse angle to the bottom of the recess; and
   wherein the obtuse angle is between 95° and 120°.

4. A hybrid photonic integrated circuit (PIC) comprising:
   a main photonic integrated circuit (PIC), including a first waveguide, an electrical connector for transmitting electrical signals from an external source, and a first electrode mounted in a recess therein;
   a secondary device mounted in the recess, including a second waveguide, aligned with the first waveguide, and a second electrode connected to the first electrode; and
   a conductive layer extending from the first electrode along a bottom of the recess out from underneath the secondary device, and electrically connected to the electrical connector;
   wherein the electrical connector comprises an electrical pad on an upper surface of the main PIC, and a conductive wire bond extending from the conductive layer on the bottom of the recess to the electrical pad on the upper surface of the main PIC.

5. A hybrid photonic integrated circuit (PIC) comprising:
   a main photonic integrated circuit (PIC), including a first waveguide, an electrical connector for transmitting electrical signals from an external source, and a first electrode mounted in a recess therein;
   a secondary device mounted in the recess, including a second waveguide, aligned with the first waveguide, and a second electrode connected to the first electrode; and
   a conductive layer extending from the first electrode along a bottom of the recess out from underneath the secondary device, and electrically connected to the electrical connector;
   wherein the electrical connector comprises a conductive wire bond extending from the conductive layer.

6. The hybrid PIC according to claim 5, wherein the first electrode comprises a stack of conductive metal layers.

7. The hybrid PIC according to claim 1, wherein the secondary device includes a gain medium comprised of a Group III-V material; and wherein the main PIC comprises a silicon photonic integrated circuit.

8. The hybrid PIC according to claim 1, wherein the main PIC comprises a multi-layer structure, including the first waveguide, and cladding layer, mounted on a substrate;
   wherein the substrate comprises a material more thermally conductive than the cladding layer; and
   wherein the recess extends through the cladding layer to the substrate, whereby the first electrode is mounted on the substrate.

9. The hybrid PIC according to claim 5, further comprising:
   a first alignment feature on the main photonic integrated circuit; and
   a second alignment feature on the secondary device in contact with the first alignment feature.

10. The hybrid PIC according to claim 9, wherein the first alignment feature comprises a surface of the first waveguide, and the second alignment feature comprises a surface at or close to the second waveguide.

* * * * *